United States Patent
Chu et al.

(10) Patent No.: US 9,397,183 B2
(45) Date of Patent: Jul. 19, 2016

(54) SEMICONDUCTOR MEMORY DEVICE WITH ONO STACK

(71) Applicant: Powerchip Technology Corporation, Hsinchu (TW)

(72) Inventors: Chien-Lung Chu, Hsinchu (TW); Chun-Hung Chen, Hsinchu County (TW); Ta-Chien Chiu, Miaoli County (TW)

(73) Assignee: Powerchip Technology Corporation, Hsinchu Science Park, Hsinchu (TW)

( * ) Notice: Subject to any disclaimer, the term of this patent is extended or adjusted under 35 U.S.C. 154(b) by 0 days.

(21) Appl. No.: 14/602,283

(22) Filed: Jan. 22, 2015

(65) Prior Publication Data

US 2016/0104785 A1    Apr. 14, 2016

(30) Foreign Application Priority Data

Oct. 14, 2014    (TW) .............................. 103135549 A

(51) Int. Cl.
*H01L 21/336* (2006.01)
*H01L 29/49* (2006.01)
*H01L 29/66* (2006.01)
*H01L 29/06* (2006.01)
*H01L 21/762* (2006.01)
*H01L 29/40* (2006.01)
*H01L 21/3105* (2006.01)
*H01L 21/28* (2006.01)
*H01L 27/088* (2006.01)
*H01L 27/115* (2006.01)

(52) U.S. Cl.
CPC ...... *H01L 29/4925* (2013.01); *H01L 21/28035* (2013.01); *H01L 21/31055* (2013.01); *H01L 21/762* (2013.01); *H01L 27/088* (2013.01); *H01L 27/11521* (2013.01); *H01L 29/0649* (2013.01); *H01L 29/401* (2013.01); *H01L 29/6653* (2013.01); *H01L 29/6656* (2013.01)

(58) Field of Classification Search
CPC .............................. H01L 29/78; H01L 21/336
USPC ......................................................... 438/270
See application file for complete search history.

(56) References Cited

U.S. PATENT DOCUMENTS

| | | | |
|---|---|---|---|
| 6,461,915 B1 | 10/2002 | Rudeck | |
| 6,548,353 B2 | 4/2003 | Tseng | |
| 6,579,761 B1 | 6/2003 | Hsieh | |
| 6,627,945 B1 | 9/2003 | Tripsas et al. | |
| 8,207,036 B2 | 6/2012 | Purayath et al. | |
| 8,537,619 B2 | 9/2013 | Sakamoto et al. | |
| 8,546,876 B2 * | 10/2013 | Juengling | G11C 11/401 257/330 |
| 8,592,885 B2 | 11/2013 | Kinoshita et al. | |
| 2002/0028541 A1 * | 3/2002 | Lee | G11C 16/3427 438/149 |
| 2003/0001225 A1 * | 1/2003 | Goda | H01L 21/76232 257/499 |
| 2004/0130934 A1 * | 7/2004 | Prall | G11C 11/5692 365/154 |
| 2005/0145921 A1 * | 7/2005 | Chang | H01L 27/115 257/315 |
| 2006/0124967 A1 * | 6/2006 | Prall | G11C 11/5692 257/202 |

(Continued)

*Primary Examiner* — Caleb Henry
(74) *Attorney, Agent, or Firm* — Winston Hsu; Scott Margo

(57) ABSTRACT

A method for fabricating semiconductor device is disclosed. The method includes the steps of: providing a substrate having a first gate layer and a first dielectric layer thereon, and a shallow trench isolation (STI) in the substrate and surrounding the first gate layer and the first dielectric layer; removing the first dielectric layer; forming a first spacer on the sidewall of the STI above the first gate layer; and using the first spacer as mask to remove part of the first gate layer and part of the substrate for forming a first opening while defining a first gate structure and a second gate structure.

7 Claims, 8 Drawing Sheets

(56) References Cited

U.S. PATENT DOCUMENTS

| | | | |
|---|---|---|---|
| 2006/0128104 A1* | 6/2006 | Prall | G11C 11/5692 438/279 |
| 2007/0057324 A1* | 3/2007 | Tews | H01L 29/6653 257/347 |
| 2007/0122971 A1* | 5/2007 | Dobuzinsky | H01L 21/26586 438/257 |
| 2007/0249110 A1* | 10/2007 | Choi | H01L 21/28273 438/167 |
| 2012/0217561 A1* | 8/2012 | Khakifirooz | H01L 21/84 257/314 |
| 2014/0015029 A1* | 1/2014 | Hsu | H01L 21/28273 257/316 |
| 2014/0021534 A1* | 1/2014 | Verma | H01L 21/82385 257/330 |
| 2014/0084354 A1* | 3/2014 | Sato | H01L 29/42376 257/315 |
| 2014/0183614 A1* | 7/2014 | Li | H01L 29/42324 257/316 |
| 2014/0264540 A1* | 9/2014 | Tan | H01L 45/1226 257/320 |
| 2015/0048439 A1* | 2/2015 | Shum | H01L 29/7816 257/326 |
| 2015/0179662 A1* | 6/2015 | Makala | H01L 27/11582 257/314 |
| 2015/0187783 A1* | 7/2015 | Chuang | H01L 27/11526 257/314 |
| 2015/0228739 A1* | 8/2015 | Tang | H01L 29/42324 257/319 |
| 2015/0236038 A1* | 8/2015 | Pachamuthu | H01L 27/1157 257/326 |

* cited by examiner

SEMICONDUCTOR MEMORY DEVICE WITH ONO STACK

BACKGROUND OF THE INVENTION

1. Field of the Invention

The invention relates to a semiconductor device, and more particularly, to a non-volatile memory and method for fabricating the same.

2. Description of the Prior Art

A flash memory is a type of non-volatile memory, which can preserve data within the memory even when an external power supply is off. Recently, because flash memories are electrically re-writable and electrically re-erasable, they have been widely applied in the fabrication of electrical products, such as mobile phones, digital cameras, video players, personal digital assistants (PDA) or systems on a chip (SOC).

Unfortunately, performance of flash memory today is largely affected by the design of its gate active area. Hence, how to alter the current memory architecture to improve the overall performance of the device has become an important task in this field.

SUMMARY OF THE INVENTION

According to a preferred embodiment of the present invention, a method for fabricating semiconductor device is disclosed. The method includes the steps of: providing a substrate having a first gate layer and a first dielectric layer thereon, and a shallow trench isolation (STI) in the substrate and surrounding the first gate layer and the first dielectric layer; removing the first dielectric layer; forming a first spacer on the sidewall of the STI above the first gate layer; and using the first spacer as mask to remove part of the first gate layer and part of the substrate for forming a first opening while defining a first gate structure and a second gate structure.

According to another aspect of the present invention, a semiconductor device is disclosed. The semiconductor device includes: a substrate; a first gate structure and a second gate structure on the substrate; a spacer in part of the substrate and between the first gate structure and the second gate structure; a shallow trench isolation (STI) surrounding the first gate structure and the second gate structure; and an oxide-nitride-oxide (ONO) stack on the STI, the spacer, the first gate structure, and the second gate structure.

According to another aspect of the present invention, a semiconductor device is disclosed. The semiconductor device includes: a substrate; a first gate structure and a second gate structure on the substrate; a shallow trench isolation (STI) surrounding the first gate structure and the second gate structure; a dielectric layer between the first gate structure and the second gate structure and in part of the substrate, wherein the top surface of the dielectric layer is lower than the top surface of the STI; and an oxide-nitride-oxide (ONO) stack on the STI, the dielectric layer, the first gate structure, and the second gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
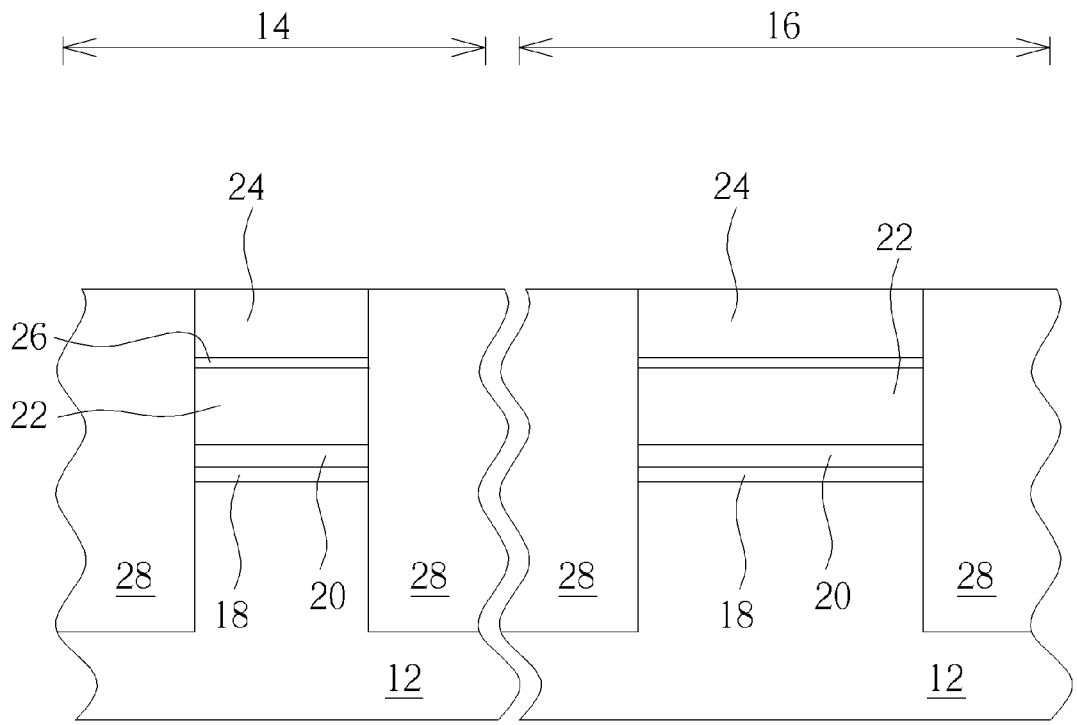
FIGS. 1-7 illustrate a method for fabricating semiconductor device according to a preferred embodiment of the present invention.

Referring to FIGS. 1-7, FIGS. 1-7 illustrate a method for fabricating semiconductor device according to a preferred embodiment of the present invention. As shown in FIG. 1, a substrate 12 is first provided, and a memory region 14 and a periphery region 16 are defined on the substrate 12. Each of the memory region 14 and the periphery region 16 includes a gate dielectric layer 18, a first gate layer 20 on the gate dielectric layer 18, a second gate layer 22 on the first gate layer 20, a dielectric layer 24 on the second gate layer 22, another dielectric layer 26 between the dielectric layer 24 and the second gate layer 22, and a shallow trench isolation (STI) 28 within part of the substrate 12 and surrounding the gate dielectric layer 18, the first gate layer 20, the second gate layer 22, the dielectric layer 24 and dielectric layer 26.

In this embodiment, the gate dielectric layer 18, dielectric layer 26 and STI 28 are preferably composed of silicon oxide, the first gate layer 20 is composed of undoped polysilicon, the second gate layer 22 is composed of doped polysilicon, and the dielectric layer 24 is composed of silicon nitride, but not limited thereto. The formation of these elements could be accomplished by sequentially forming a gate dielectric material layer (not shown), a first gate material layer (not shown), a second gate material layer (not shown), a dielectric material layer (not shown), and another dielectric material layer (not shown) on the substrate 12 surface, conducting an etching process to pattern each material layer to form STI (not shown) in part of the substrate 12, and then depositing a dielectric material (not shown) accompanied by a planarizing process thereafter.

Figure 2:
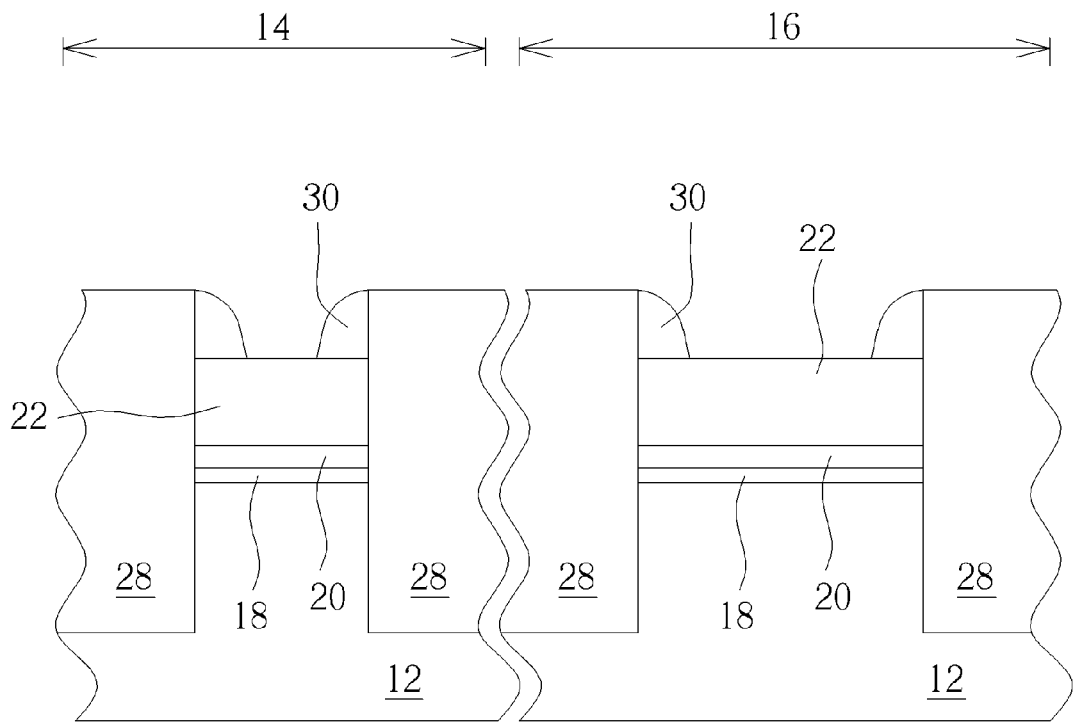

Next, as shown in FIG. 2, dielectric layers 24 and 26 are completely removed from the memory region 14 and periphery region 16, and a spacer 30 is formed on the sidewalls of the STI 28 above the second gate layer 22 in each memory region 14 and periphery region 16. In this embodiment, the formation of the spacer 30 could be accomplished by first depositing a dielectric material (not shown) composed of silicon nitride on the STI 28 and second gate layer 22, and then conducting an etching back process to remove part of the dielectric material for forming the spacer 30.

Figure 3:
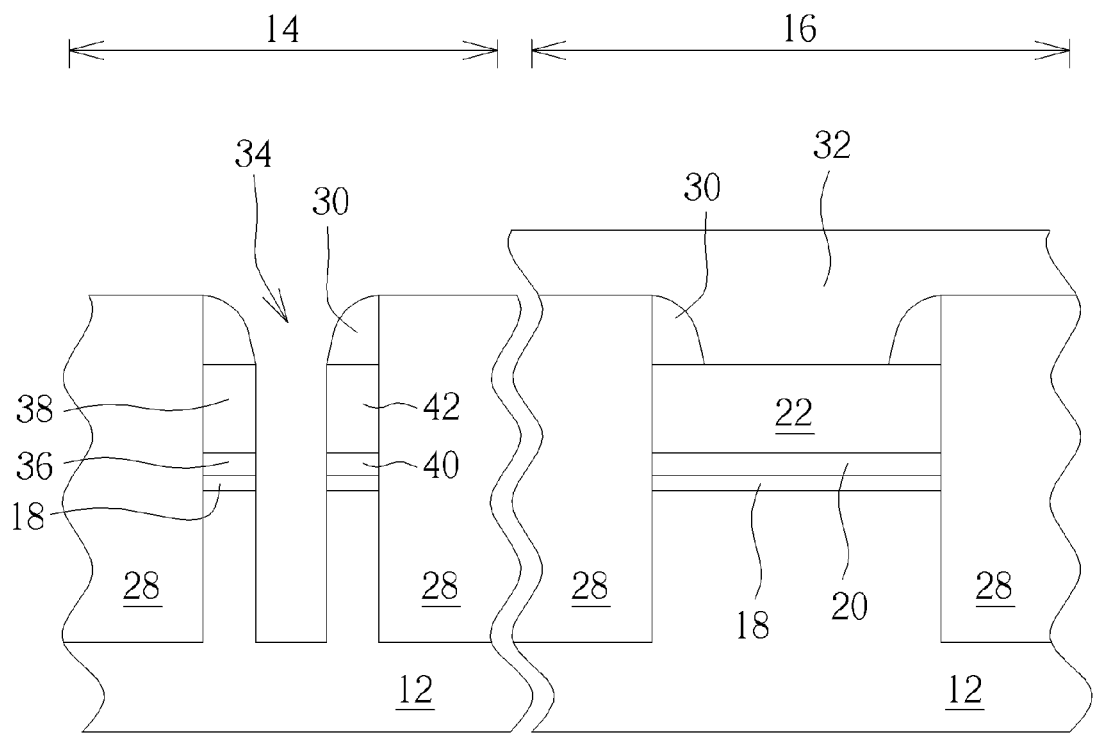

Next, as shown in FIG. 3, a patterned resist 32 is formed to cover the periphery region 16, and an etching process is conducted by using the patterned resist 32 and spacer 30 of the memory region 14 as mask to remove part of the second gate layer 22, part of the first gate layer 20, part of the gate dielectric layer 18, and part of the substrate 12 for forming an opening 34. In this embodiment, the formation of the opening 34 preferably separates the first gate layer 20 and second gate layer 22 into two sides while defining two sets floating gate structures, including a first gate structure 36 and third gate structure 38 atop on the left and a second gate structure 40 and fourth gate structure 42 atop on the right. In addition, the distance from the bottom surface of the gate dielectric layer 18 to the bottom surface of the opening 34 is preferably 1000

Angstroms to 1500 Angstroms, and the bottom surface of the opening 34 is preferably aligned with the bottom surface of the STI 28.

Figure 4:
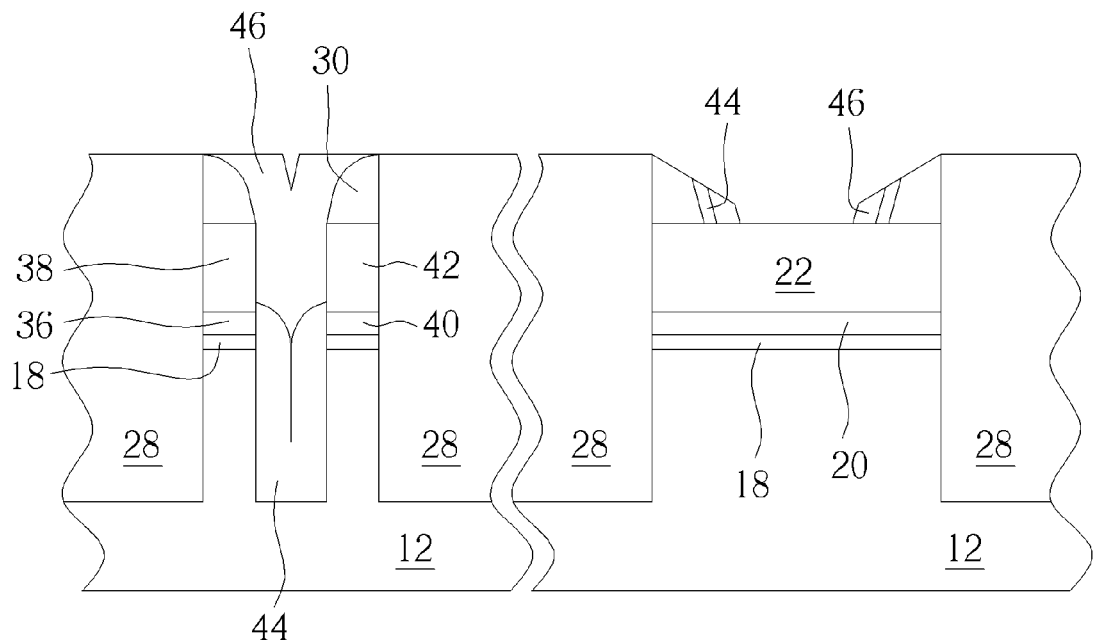

Next, as shown in FIG. 4, after stripping the patterned resist 32 from the periphery region 16, a dielectric layer (not shown) composed of silicon oxide is deposited on the memory region 14 and periphery region 16, and an etching back is conducted to form a spacer 44 in the bottom of the opening 34 of the memory region 14 and a spacer 44 adjacent to the spacer 30 of the periphery region 16 at the same time. It should be noted that an oxidation process could be selectively conducted before the formation of the spacer 44 to form another thin oxide layer on the memory region 14 and periphery region 16, which is also within the scope of the present invention. Next, another deposition and etching back process is carried out by first depositing a dielectric layer (not shown) composed of silicon nitride on the memory region 14 and periphery region 16, and an etching back process is conducted thereafter to form another spacer 46 on the spacer 44 within the memory region 14 and a spacer 46 adjacent to the spacer 44 within the periphery region 16 simultaneously.

Figure 5:
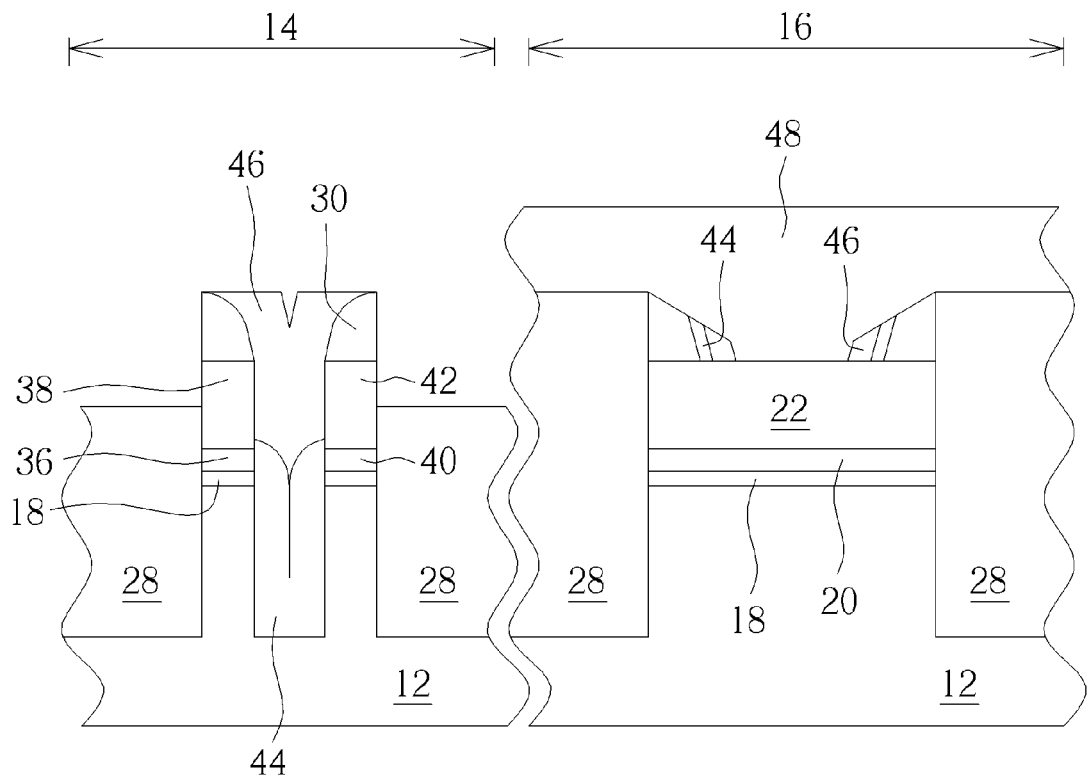

Next, as shown in FIG. 5, a patterned resist 48 is formed to cover the periphery region 16, and a dry etching or wet etching process is conducted by using the patterned resist 48 as mask to remove part of the STI 28 on the memory region 14 so that the top surface of the remaining STI 28 is preferably between the top and bottom surfaces of the third gate structure 38 and fourth gate structure 42.

Figure 6:
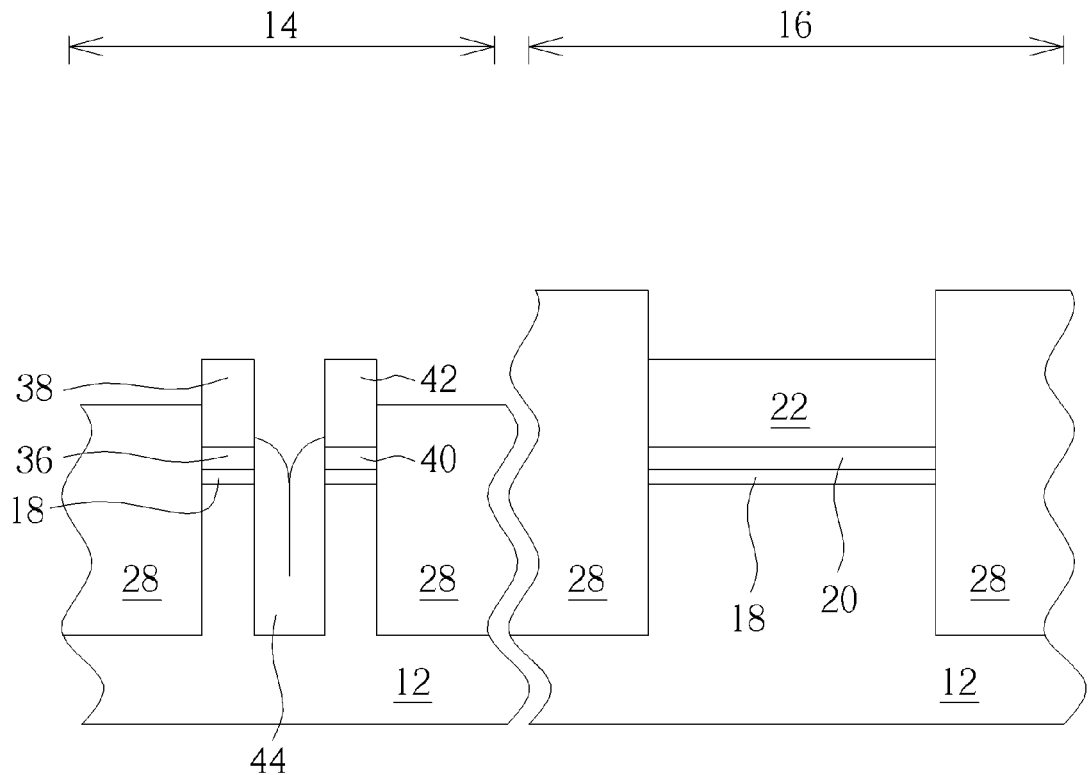

Next, as shown in FIG. 6, after stripping the patterned resist 48 from the periphery region 16, an etching process, such as a wet etching process is conducted to remove the spacer 44 composed of silicon oxide from the periphery region 16. Another etching process, such as a dry etching or wet etching process is conducted thereafter to completely remove the spacers 46 and 30 composed of silicon nitride from the memory region 14 and periphery region 16. This exposes the spacer 44 situating on bottom of the memory region 14 and the top surfaces of the third gate structure 38 and fourth gate structure 42 of the memory region 14.

Figure 7:
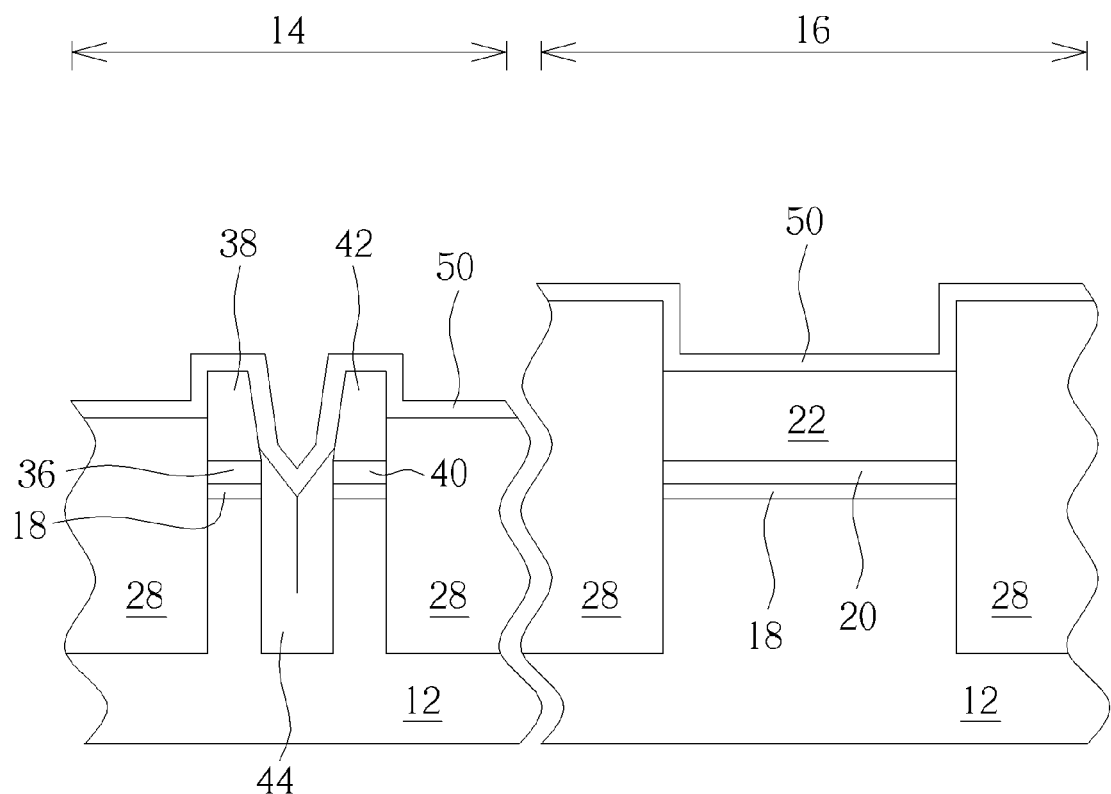

Next, as shown in FIG. 7, a wet etching process is conducted to remove part of the third gate structure 38 and fourth gate structure 42 for forming an inclined surface, and an oxide-nitride-oxide (ONO) stack 50 is formed on the STI 28, the spacer 44, the third gate structure 38 and fourth gate structure 42 of the memory region 14, and on the STI 28 and second gate layer 22 of the periphery region 16. This completes the fabrication of a semiconductor device according to a preferred embodiment of the present invention.

Referring to the memory region 14 of FIG. 7, which also discloses a memory device structure according to an embodiment of the present invention. The memory device preferably includes a substrate 12, a first gate structure 36 and a second gate structure 40 on the substrate 12, a third gate structure 38 and a fourth gate structure 42 on the first gate structure 36 and second gate structure 40 respectively, a spacer 44 disposed in part of the substrate 12 and between the first gate structure 36 and second gate structure 40, a STI 28 disposed in the substrate 12 and surrounding the first gate structure 36 and second gate structure 40, and a ONO stack 50 disposed on the STI 28, the spacer 44, the third gate structure 38 and the fourth gate structure 42.

In this embodiment, the bottom of the spacer 44 is preferably even with the bottom of the STI 28, the first gate structure 36 and second gate structure 40 are preferably composed of undoped polysilicon, and the third gate structure 38 and fourth gate structure 42 are composed of doped polysilicon, but not limited thereto.

Figure 8:
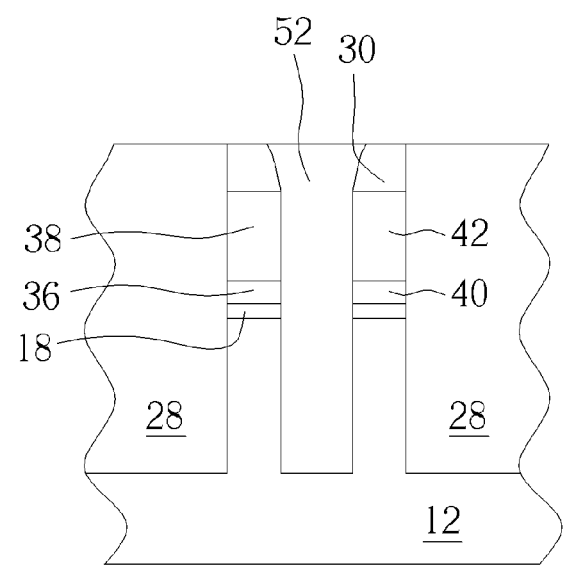
FIGS. 8-9 illustrate a method for fabricating semiconductor device according to a second embodiment of the present invention.
Figure 9:
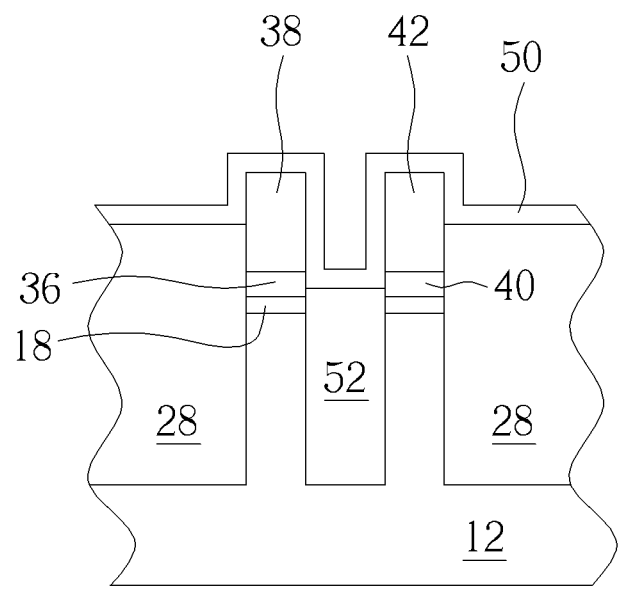

Referring to FIGS. 8-9, FIGS. 8-9 illustrate a method for fabricating semiconductor device according to a second embodiment of the present invention. Preferably, as only the fabrication conducted on the memory region 14 is altered in this embodiment while the periphery 16 is kept intact, only the memory region 14 is shown in FIGS. 8-9. As shown in FIG. 8, fabrication processes conducted on memory region from FIGS. 1-3 are first carried out, such as by using the spacer 30 of the memory region 14 as mask to form an opening 34 for separating the first gate layer 20 and second gate layer 22 into two sets of gate structures, and then filling the opening 34 with a dielectric layer 52 composed of silicon oxide. Next, a planarizing process such as chemical mechanical polishing (CMP) process is conducted to remove part of the STI 28, part of the dielectric layer 52, and part of the spacer 30 so that the surface of the STI 28 is even with the surfaces of the remaining dielectric layer 52 and spacer 30.

Next, as shown in FIG. 9, an etching process is conducted to remove part of STI 28 and part of dielectric layer 52 both composed of silicon oxide so that the top surface of the remaining STI 28 is between the top and bottom surface of the third gate structure 38 and fourth gate structure 42 while the top surface of the remaining dielectric layer 52 is slightly lower than the bottom surface of the third gate structure 38 and fourth gate structure 42. In this embodiment, the top surface of the remaining dielectric layer 52 is preferably lower than the top surface of the STI 28, in which the height difference between these two layers could be adjusted according to the demand of the product. Next, another etching process is conducted to remove the spacer 30 composed of silicon nitride for exposing the surfaces of the third gate structure 38 and fourth gate structure 42. An ONO stack 50 is then deposited thereafter on the STI 28, the dielectric layer 52, the third gate structure 38 and the fourth gate structure 42.

Figure 10:
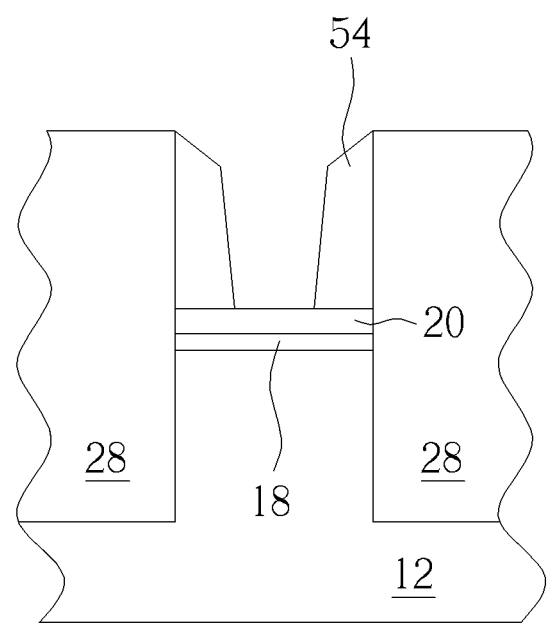
FIGS. 10-11 illustrate a method for fabricating semiconductor device according to a third embodiment of the present invention.
Figure 11:
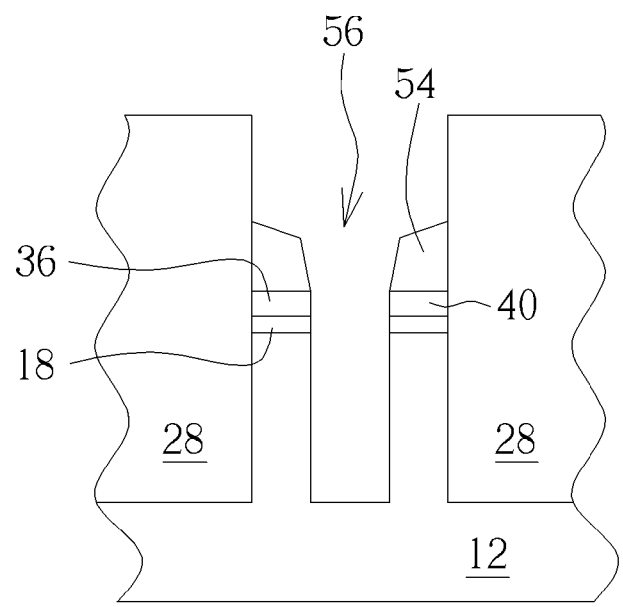

Referring to FIGS. 10-11, FIGS. 10-11 illustrate a method for fabricating semiconductor device according to a third embodiment of the present invention. Similar to the previous embodiment, as only the fabrication conducted on memory region 14 is altered in this embodiment while the periphery 16 is kept intact, only the memory region 14 is shown in FIGS. 10-11. As shown in FIG. 10, fabrication processes conducted from FIGS. 1-2 are first carried out by forming a spacer 54 on the sidewalls of the STI 28 above the first gate layer 20 in the memory region 14. It should be noted that since only one single gate layer is utilized in this embodiment, the gate layer is preferably composed of undoped polysilicon and the height of the spacer 54 is substantially higher than the height of the spacer 30 from previous embodiment. The formation of the spacer 54 of this embodiment is accomplished by first depositing a material layer composed of doped polysilicon on the STI 28 and the first gate layer 20, and an etching back is conducted by adjusting the etching selectivity between doped polysilicon and undoped polysilicon to remove part of the material layer for forming the spacer 54, in which the resulting spacer 54 is preferably composed of doped polysilicon.

Next, as shown in FIG. 11, an etching process is conducted to remove part of the first gate layer 20, part of the gate dielectric layer 18, and part of the substrate 12 to form an opening 56 while dividing the first gate layer 20 into a first gate structure 36 and second gate structure 40. In this embodiment, part of the spacer 54 is removed along with the formation of the opening 56 so that the top of the spacer 54 is preferably lower than the top surface of the STI 28 after the formation of the opening 56, and the remaining spacer 54 composed of polysilicon could also be used as third gate structure 38 and fourth gate structure 42 thereafter. Next, part of the STI 28 could be removed and an ONO stack could be formed on the STI 28 and the two sets of gate structures as previous embodiments, and the details of which are not explained herein for the sake of brevity.

Figure 12:
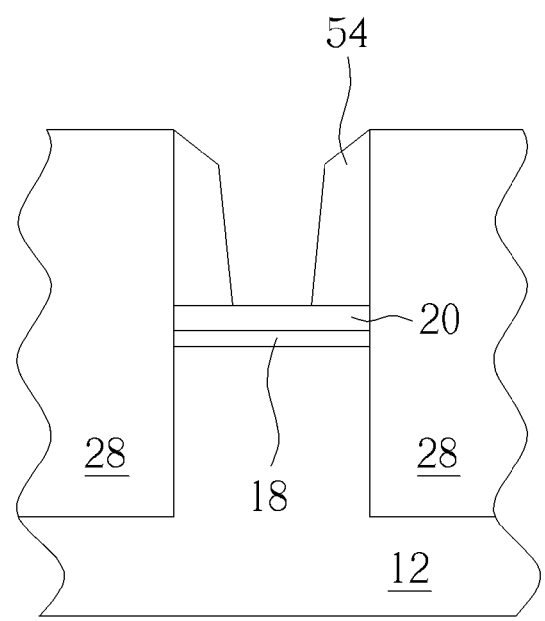
FIGS. 12-15 illustrate a method for fabricating semiconductor device according to a fourth embodiment of the present invention.

Referring to FIGS. 12-15, FIGS. 12-15 illustrate a method for fabricating semiconductor device according to a fourth embodiment of the present invention. Similar to the previous embodiment, as only the fabrication conducted on memory region 14 is altered in this embodiment while the periphery 16 is kept intact, only the memory region 14 is shown in FIGS. 12-15. As shown in FIG. 12, fabrication processes conducted from FIGS. 1-2 are first carried out by forming a spacer 54 on the sidewalls of the STI 28 above the first gate layer 20, in which the spacer 54 is preferably composed of silicon nitride. Similar to the third embodiment, since only one single gate layer is utilized in this embodiment, the height of the spacer 54 is substantially higher than the height of the spacer 30 from previous embodiment.

Figure 13:
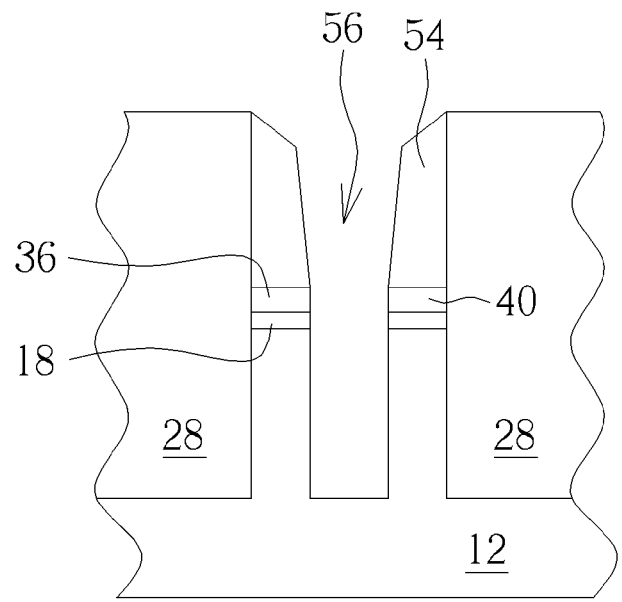

Next, as shown in FIG. 13, an etching process is conducted to remove part of the first gate layer 20, part of the gate dielectric layer 18, and part of the substrate 12 to form an opening 56 while separating the first gate layer 20 into first gate structure 36 and second gate structure 40.

Figure 14:
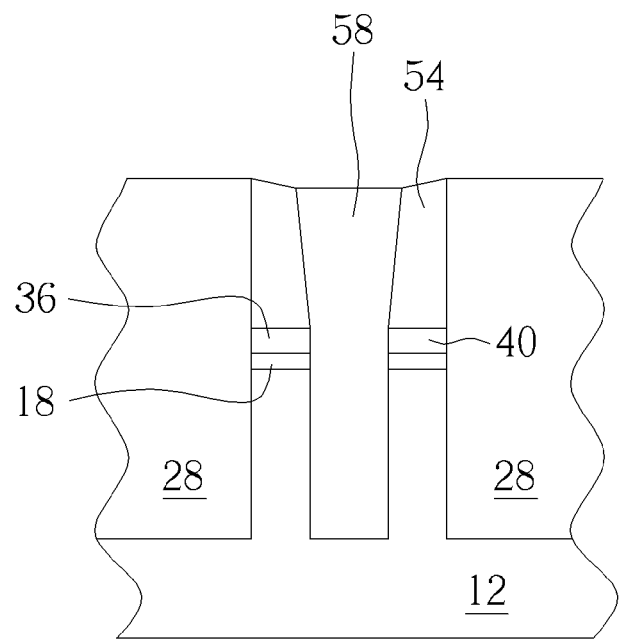

Next, as shown in FIG. 14, a dielectric layer 58 is formed to fill the opening 56, in which the dielectric layer 58 is preferably composed of silicon oxide. A planarizing process such as CMP process or an etching process is then conducted to remove part of the STI 28, part of the dielectric layer 58, and part of the spacer 54 so that the top surface of the STI 28 is substantially even with the surfaces of the remaining dielectric layer 58 and spacer 54.

Figure 15:
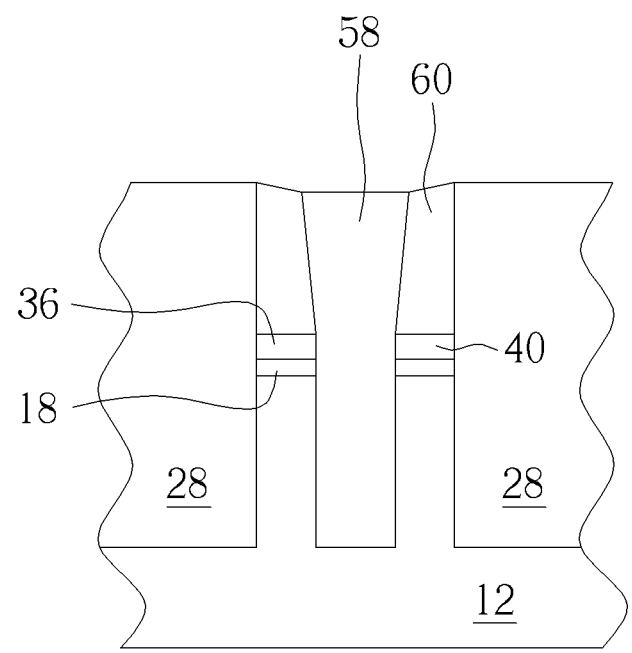

Next, as shown in FIG. 15, another etching process is conducted to completely remove the spacer 54 composed of silicon nitride for forming two recesses (not shown), a material layer composed of polysilicon is formed on the STI 28 to fill into the recesses, and a planarizing process such as CMP process is conducted to remove part of the polysilicon material layer for forming two polysilicon gates 60, which are preferably analogous to the third gate structure 38 and fourth gate structure 42 in the previous embodiments. Next, part of the STI 28 could be removed and an ONO stack could be formed on the STI 28 and the two sets of gate structures similar to the previous embodiments, and the details of which are not explained herein for the sake of brevity.

Overall, the present invention preferably separates the gate layer of original memory unit into two sets of gate structures without using additional photomask so that performance of the memory unit could be improved by lowering active area of the gates. Moreover, inclined sidewalls of the third gate structure and the fourth gate structure from FIG. 7 along with spacers having substantially arctic sidewall profile could also be used to increase the deposition rate of ONO stack so that the ONO stack could be easily covered on the surface of the sidewalls while being deposited onto the STI and gate structures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a first gate structure and a second gate structure on the substrate, wherein the first gate structure has a first inclined surface and the second gate structure has a second inclined surface facing the first inclined surface;
   a spacer in part of the substrate and between the first gate structure and the second gate structure;
   a shallow trench isolation (STI) surrounding the first gate structure and the second gate structure, wherein the STI is in direct contact with the first gate structure and the second gate structure, wherein a bottom of the spacer is even with a bottom of the STI; and
   an oxide-nitride-oxide (ONO) stack on the STI, the spacer, the first gate structure, and the second gate structure.

2. The semiconductor device of claim 1, further comprising a third gate structure between the first gate structure and the substrate and a fourth gate structure between the second gate structure and the substrate.

3. The semiconductor device of claim 2, wherein the third gate structure and the fourth gate structure comprise undoped polysilicon.

4. The semiconductor device of claim 1, wherein the first gate structure and the second gate structure comprise doped polysilicon.

5. A semiconductor device, comprising:
   a substrate;
   a first gate structure and a second gate structure on the substrate, wherein the first gate structure has a first inclined surface and the second gate structure has a second inclined surface facing the first inclined surface, wherein the first gate structure and the second gate structure comprise doped polysilicon;
   a shallow trench isolation (STI) surrounding the first gate structure and the second gate structure;
   a dielectric layer between the first gate structure and the second gate structure and in part of the substrate, wherein a top surface of the dielectric layer is lower than a top surface of the STI, wherein the STI is in direct contact with the first gate structure and the second gate structure; and
   an oxide-nitride-oxide (ONO) stack on the STI, the dielectric layer, the first gate structure, and the second gate structure.

6. The semiconductor device of claim 5, further comprising a third gate structure between the first gate structure and the substrate and a fourth gate structure between the second gate structure and the substrate.

7. The semiconductor device of claim 6, wherein the third gate structure and the fourth gate structure comprise undoped polysilicon.

* * * * *